United States Patent [19]

Harmon et al.

[11] Patent Number: 5,381,305
[45] Date of Patent: Jan. 10, 1995

[54] CLIP FOR CLAMPING HEAT SINK MODULE TO ELECTRONIC MODULE

[75] Inventors: Ronald A. Harmon, Hudson; Giovanni Urrata, Wakefield, both of Mass.

[73] Assignee: Wakefield Engineering, Inc., Wakefield, Mass.

[21] Appl. No.: 172,530

[22] Filed: Dec. 22, 1993

[51] Int. Cl.⁶ .............................................. H05H 7/20
[52] U.S. Cl. ............................. 361/704; 165/80.3; 174/16.3; 361/690; 361/710; 361/715; 257/718; 257/719
[58] Field of Search ................... 165/80.3, 185; 174/16.3; 257/718, 719, 726, 727; 361/704, 690, 707–722

[56] References Cited

U.S. PATENT DOCUMENTS 5,241,453  8/1993  Bright et al. .................... 361/704
5,276,585  1/1994  Smithers ......................... 361/704

OTHER PUBLICATIONS

International Electronic Research Corporation Bulletin No. 505, Feb. 1992.
Thermalloy Heat Sinks, Jun. 1991.
Wakefield Engineering 669 Series Spider Clip ™ Heat Sinks and Clip Assembly etc., Sep. 1992.
Thermalloy New Heat Sink Spring Clip for use with AMP Low Insertion Force PGA Sockets, Apr. 1993.
International Electronic Research Corporation Bulletin No. 503, Jan. 1992.

*Primary Examiner*—Gregory N. Thompson
*Attorney, Agent, or Firm*—Blodgett & Blodgett

[57] ABSTRACT

A spring clip for clamping a heat sink module to an electronic module. The heat sink module has a flat upper surface and a plurality of vertical cooling elements which extend upwardly from the upper surface of the heat sink module. The clip includes a central potion which engages the upper surface of the heat sink module and a pair of oppositely extending resilient end potions which are cantilevered from the central potion. A vertical leg portion is connected to the free end of each end portion of the clip and extends downwardly along one of the end surfaces of the electronic module. Each leg potion has an inwardly extending projection which has an upwardly facing edge surface for engaging a downwardly facing edge surface of the electronic module at one of the lower corners of the electronic module upon downward bending of the end potion so that the projection is biased upwardly against the lower corner of the electronic module due to the resiliency of the end potion.

19 Claims, 4 Drawing Sheets

CLIP FOR CLAMPING HEAT SINK MODULE TO ELECTRONIC MODULE

BACKGROUND OF THE INVENTION

The present invention is directed to a clip and heat sink assembly for application to a standard electronic module such as a microprocessor chip which is adapted to be mounted into a standard socket assembly. The invention is also directed to a clip for clamping a standard heat sink module to an electronic module.

A standard heat sink module has a flat horizontal base which includes a flat bottom surface for abutting the flat upper surface of a microprocessor chip module. The heat sink module also includes an upper surface and a plurality of parallel rows of spaced vertical cooling pins or cooling vanes. Clips have been developed for clamping a heat sink module to a microprocessor chip module which is connected to a socket module. One such prior art clip has a grid-like resilient horizontal main section which fits over the cooling pins and rests on the upper surface of the heat sink module. A vertical leg is fixed to each end of the grid-like main section and extends downwardly along the outer end surfaces of the heat sink microprocessor chip module and the socket module. The lower end of each leg has a pair of apertures for receiving a pair of projections which form part of the socket module. The legs are forced downwardly against the spring bias of the main section of the clip into engagement with the projections of the socket module and maintained in this position by the spring bias of the clip. Other spring clips have been developed for clamping a standard heat sink module directly to a standard microprocessor chip module. This type of spring clip includes vertical leg portions which are provided with hooks for engaging the lower edge surface of the microprocessor chip module. The prior art spring clips are generally difficult to install and to remove because of the interference from the cooling pins. Special installing tools are required. In many cases, some of the cooling pins must be eliminated in order to accommodate the clip. In spite of the fact that prior art clips are difficult to install, they frequently become loose from their clamping function due to vibrations and other conditions normally encountered during operation of the electronic apparatus to which the clips are applied.

These and other difficulties experienced with the prior art spring clips have been obviated by the present invention.

It is, therefore, a principal object of the present invention to provide a spring clip for clamping a heat sink module to a microprocessor chip module which can be applied to and are moved from a chip module quickly and easily by hand without the need of special tools.

Another object of this invention is the pro-vision of a spring clip which will fit all types of microprocessor modules.

A further object of the present invention is the provision of a spring clip which does not require the removal or elimination of cooling pins.

It is another object of the present invention to provide a spring clip which correctly aligns the heart sink module to the microprocessor module and maintains this correct alignment when the two modules are clamped together by the spring clip.

A still further object of the invention is to provide a spring clip which will reliably maintain its clamping relationship with the heat sink module and microprocessor module package against shock and vibration while requiring a relatively low installation pressure.

It is a further object of the invention to provide a spring clip which provides uniform clamping force to the heat sink and to the microprocessor modules.

Still another object of this invention is to provide a spring clip which is simple in construction, inexpensive to manufacture and capable of a long life of useful and reliable service.

With these and other objects in view, as will be apparent to those skilled in the art, the invention resides in the combination of pans set forth in the specification and covered by the claims appended hereto.

SUMMARY OF THE INVENTION

The invention consists of a spring clip for clamping a heat sink module to an electronic module. The heat sink module has a flat upper surface and a plurality of vertical cooling elements which extend upwardly from the upper surface of the heat sink module. The clip includes a central portion which engages the upper surface of the heat sink module and a pair of oppositely extending resilient end portions which are cantilevered from the central portion. A vertical leg is connected to the free end of each end portion and extends downwardly along one of the end surfaces of the electronic module. Each leg portion has an inwardly extending projection which has an upwardly facing edge surface for engaging a downwardly facing edge surface at one of the lower corners of the electronic module upon downward bending of the end portion so that the projection is biased upwardly against the lower corner of the electronic module by the resiliency of the end portion.

BRIEF DESCRIPTION OF THE DRAWINGS

The character of the invention, however, may be best understood by reference to one of its structural forms as illustrated by the accompanying drawings, in which.

DESCRIPTION OF THE PREFERRED EMBODIMENT

Figure 1:
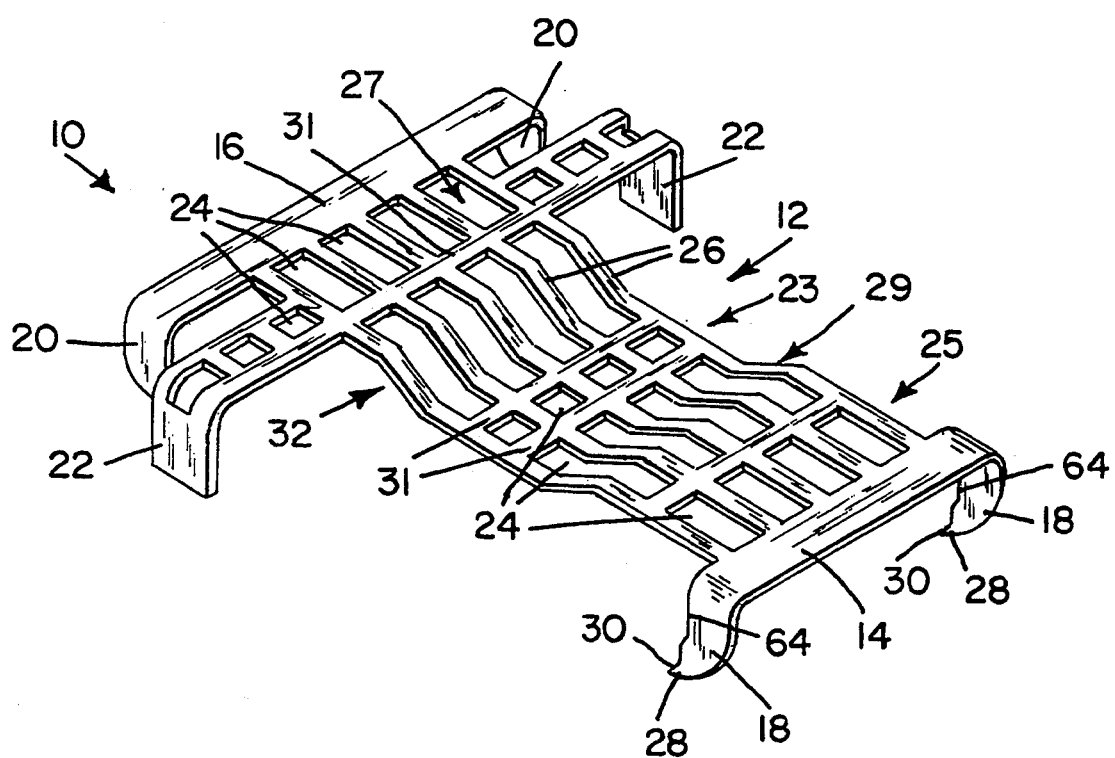
FIG. 1 is a perspective view of a spring clip embodying the principles of the present invention.
Figure 2:
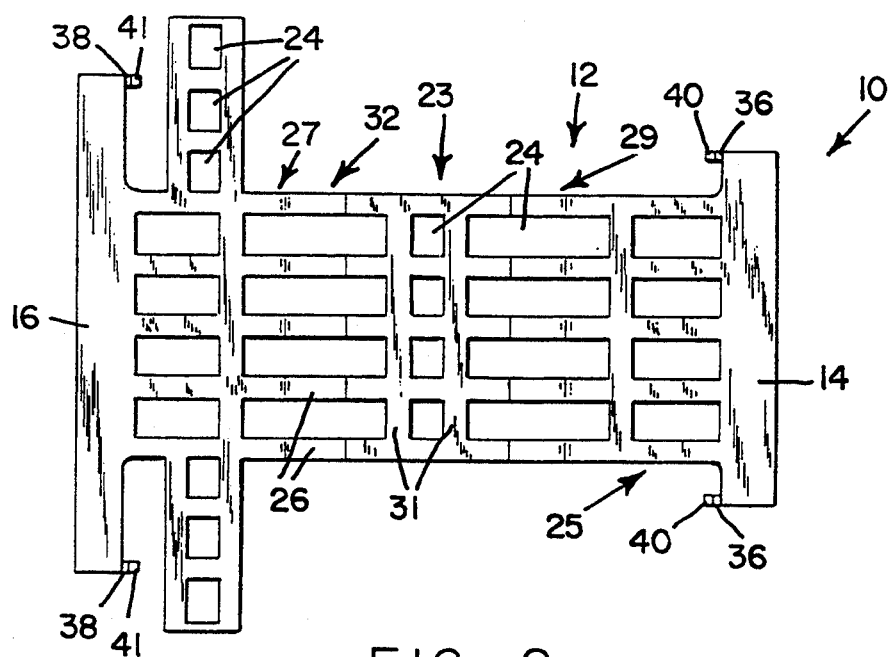
FIG. 2 is a plan view of the spring clip.

Referring first to FIGS. 1-4, the spring clip of the present invention is generally indicated by the reference numeral 10 and comprises a generally horizontal grid portion which is generally indicated by the reference numeral 12, a first horizontal finger tab 14 which is fixed to one end of the grid portion, and a second horizontal finger tab 16 which is fixed to the opposite end of the grid portion. A pair of vertical first legs 18 are fixed to the finger tab 14 and extend downwardly from the finger tab 14. A pair of second vertical legs 20 are fixed to opposite ends of the finger tab 16 and extend downwardly from the finger tab 16. A pair of locating tabs 22 extend downwardly from opposite sides of the grid portion 12 between the finger tabs 14 and 16. The grid portion 12 has a plurality of apertures 24 which define a plurality of longitudinal parallel ribs 26 and parallel cross-ribs 31. The grid portion 12 comprises a horizontal center section, generally indicated by the reference numeral 23, a horizontal first end section which is generally indicated by the reference numeral 25. The first end section 25 is connected to the center section 23 by a first transitional section, generally indicated by the reference numeral 29. A horizontal second end section generally indicated by the reference numeral 27, is connected to the opposite end of the center section, 23 by a second transitional section which is generally indicated by the reference numeral 32. The transitional sections 29 and 32 extend upwardly and outwardly from the center section 23 so that the first and second end sections 25 and 27 are spaced above the center section 23. Each end section 25 and 27 is cantilevered from the center section 23. The finger tab 14 is fixed to the outer free end of the first end section 25. The finger tab 16 is fixed to the free outer end of the second end section 27.

Figure 3:
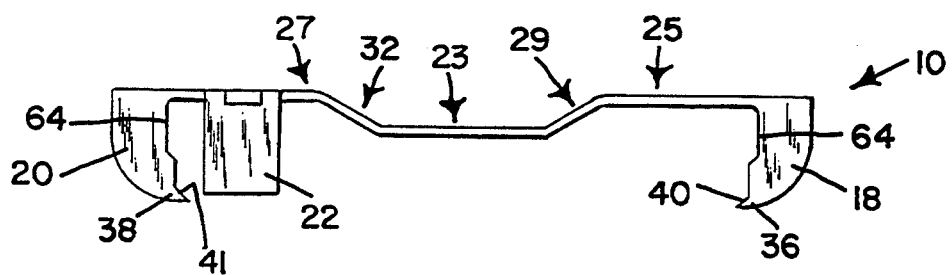
FIG. 3 is a side elevational view of the spring clip.
Figure 4:
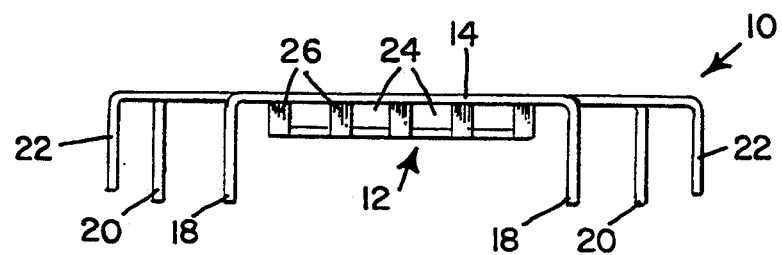
FIG. 4 is an end view of the spring clip, looking from the right of FIG. 3.

The lower end of each first leg 18 is provided with an inwardly facing projection 28 which has an angular upwardly and inwardly facing end edge surface 30. Referring also to FIG. 3, the lower end of each of the second legs 20 is provided with an inwardly facing projection 38 which has an angular upwardly and inwardly facing end edge surface 41. The spring clip 10 is made of a flexible resilient material, preferably spring steel so that each of the end sections 25 and 27 can be resiliently flexed relative to the center section 23. The first legs 18 are lateral extensions of the finger tab 14 which are permanently bent downwardly at a 90° angle to the finger tab 14 so that the broad surface of each leg 18 lies within a vertical plane which extends longitudinally of the clip from the finger tab 14 to the finger tab 16, so that leg 18 is rigid within that plane. The second legs 20 are lateral extensions of the finger tab 16 which are permanently bent downwardly at 90° to the finger tab 16 so that the broad surface of each leg 20 lies in a vertical plane which extends longitudinally of the clip from the finger tab 16 to the finger tab 14, so that each leg 20 is rigid within that plane.

Figure 5:
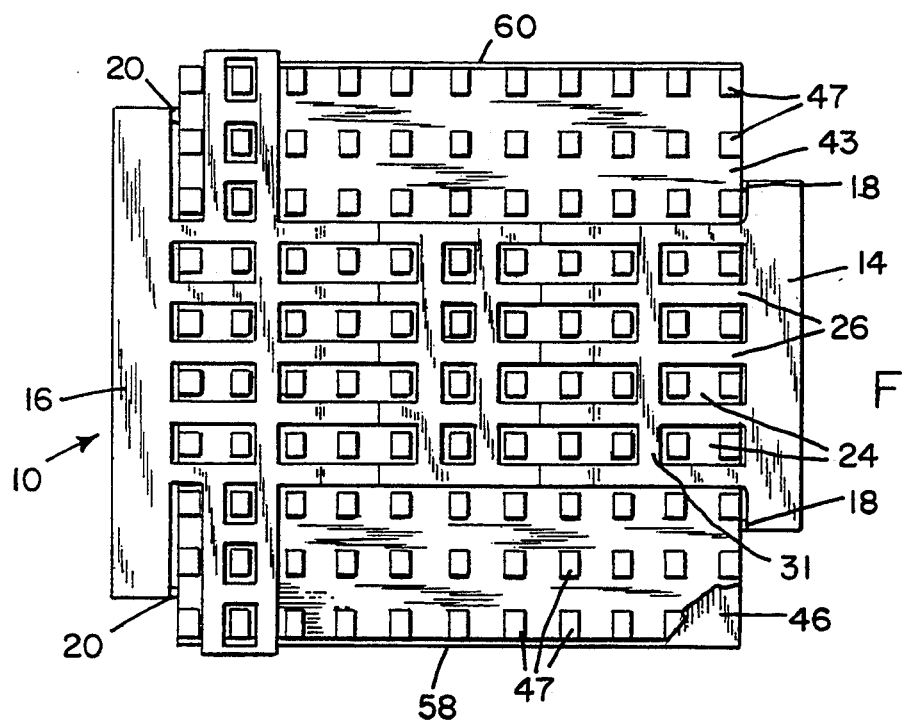
FIG. 5 is a plan view of the spring clip shown applied to a heat sink module and to an electronic module.
Figure 6:
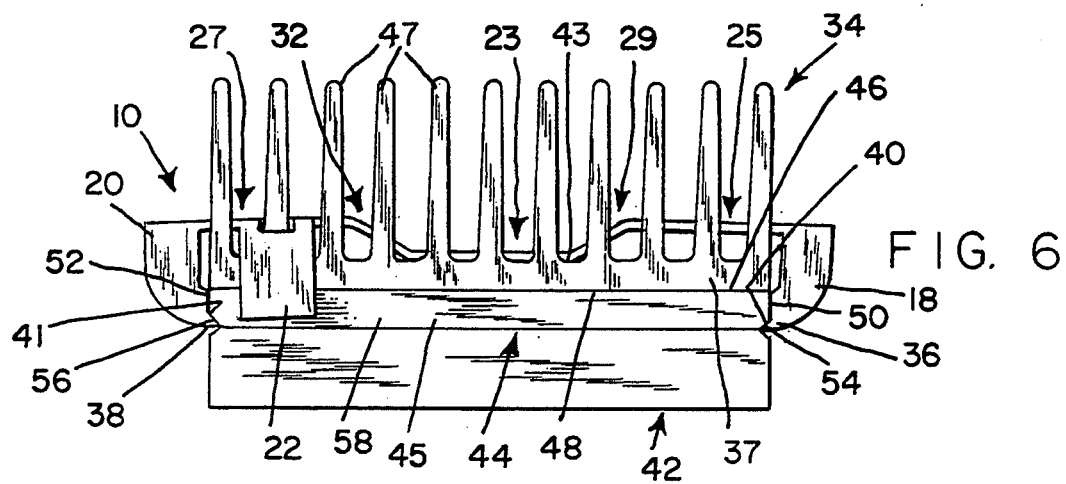
FIG. 6 is a side elevational view of the spring clip applied to the heat sink module and electronic module.
Figure 7:
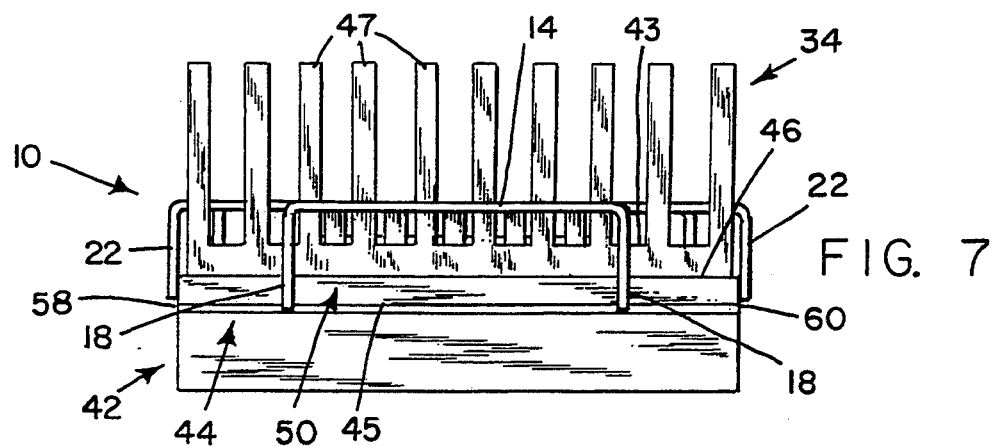
FIG. 7 is an end view of the spring clip shown applied to the heat sink module and to the electronic module, looking from right of FIG. 6.

Referring also to FIGS. 5-7, the spring clip 10 is shown in clamping position for clamping a heat sink module, generally indicated by the reference numeral 34, to an electronic module such as a microprocessor chip module, generally indicated by the reference numeral 44. The microprocessor chip module 44 is, in turn, connected to a socket module 42 in a manner well known in the art. The microprocessor chip module 44 comprises a base portion 45, a horizontal flat upper surface 46, a first end surface 50 at one end of the chip and a second end surface 52 at the opposite end of the chip. The microprocessor chip module 44 has a third end surface 58 and a fourth end surface 60 at the opposite side of the chip. The heat sink module 34 has a base 37 which has a horizontal flat upper surface 43 and a horizontal flat lower surface 48 which rests on the upper surface 46 of the chip module 44. A plurality of spaced vertical cooling pins 47 extend upwardly from the upper surface 43 of the heat sink module 34. The pins 47 are arranged in spaced parallel rows which extend from left to right as viewed in FIGS. 5 and 6.

When the clip 10 is applied to the heat sink module 34, the pins 47 extend upwardly through the apertures 24. The longitudinal ribs 26 extend between the rows of pins and the lateral ribs 31 are located in the spaces between the pins in several of the rows of pins. The legs 18 and 20 extend beyond the end surfaces of the base 37. The projections 36 and 38 extend below the lower surface 48 of the base 37 so that the first upwardly facing edge surfaces 40 engage the downwardly facing edge surfaces 54 of the chip module 44 and so that the second upwardly facing edge surfaces 41 engage the downwardly facing edge surfaces 56 of the chip module. The center section 23 of the clip engages the upper surface 43 of the heat sink module 34. The end sections 25 and 27 of the clip are spaced from the upper surface 43 of the heat sink module 34.

Figure 8:
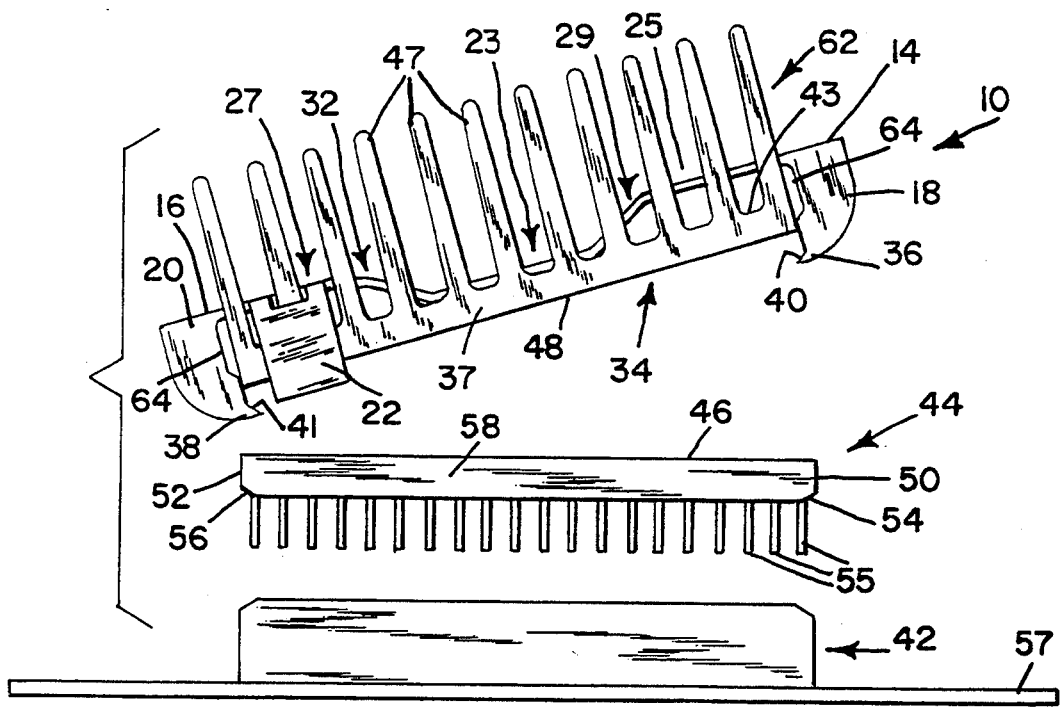
FIG. 8 is a side elevational view of the spring clip of the present invention applied to a heat sink assembly to form a spring clip and heat sink assembly module prior to its application to a microprocessor chip.
Figure 9:
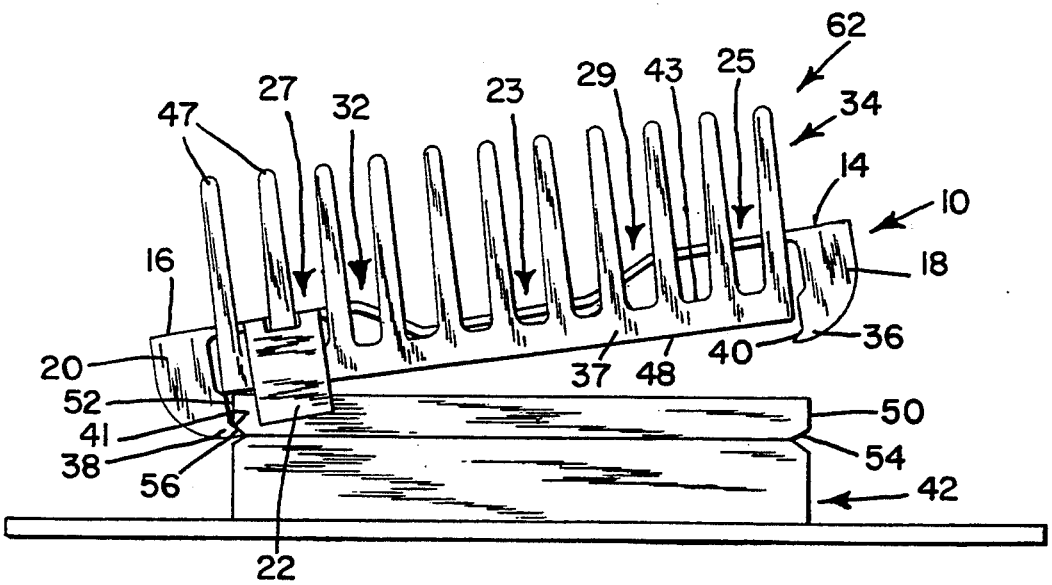
FIG. 9 is a side elevational view of the spring clip showing the spring clip partially applied to the heat sink module and the electronic module.

Referring to FIGS. 8 and 9, the heat sink module 34 is clamped to the microprocessor chip module 44 by first applying the spring clip 10 to the heat sink module 34 to form a spring clip and heat sink assembly, generally indicated by the reference numeral 62 as shown in FIG. 8. The socket module 42 is fixed to a pc board 57. The socket 42 has a plurality of apertures, not shown, in its upper surface for receiving a plurality of downwardly extending pins 55 which form part of the microprocessor chip module 44. After the microprocessor chip module 44 has been applied to the socket 42, the spring clip and heat sink assembly 62 is first positioned at an angle to the chip module 44 so that the upwardly extending surface 41 of the projection 38 bears against the downwardly facing edge surface 56 of the chip module 44 as shown in FIG. 9. The assembly 62 is, thereafter, rotated clockwise as shown in FIG. 9, about the edge surface 56 so that the bottom surface 48 of the heat sink module 34 lies flat against the upper surface 46 of the chip module 44. Downward pressure is then applied to the finger tab 14 to snap the projection 36 into the clamping position shown in FIG. 6. The distance between the projections 36 and 38 is less than the distance between the end surfaces 50 and 52 so that as the finger tab 14 is forced downwardly, the end sections 25 and 27 of the clip 10 bend slightly upwardly relative to the central section 23 to allow the projections 36 and 38 to move away from one another and allow the projection 36 to move downwardly along the end surface 50. However, in order for the upwardly extending edge surface 40 of the clip to reach the downwardly facing edge surface 54 of the chip module 44, the end sections 25 and 27 must be bent downwardly relative to the central section 23. Due to the resilient or spring-like nature of the clip 10, the downward bending of the sections 25 and 27 cause the projections 36 and 38 to be biased against the edge surfaces 54 and 56, respectively, and insures that the spring clip and heat sink assembly 62 remains clamped to the chip module 44. When the spring clip and heat sink assembly 62 is applied to the chip module 44, the locating tabs 22 extend along the end surfaces 58 and 60 to insure that the assembly 62 is properly positioned on the chip and to maintain the assembly in the proper installed position after the assembly has been installed and throughout its normal operation as an electrical component in an electronic system or apparatus. Each of the legs 18 and 20 has a relief 64 on the edge surface which faces the heat sink module 34. This provides clearance between the legs 18 and 20 and the end surfaces of the heat sink module 34 so that legs 18 and 20 bear only against the chip module 44. This insures that the clamping effect is achieved by the downward pressure of the central section 23 on the upper surface 43 of the heat sink module 34 and the upward pressure from the legs 18 and 20 on the edge surfaces 54 and 56, respectively, of the chip module 44. If, for any reason, it becomes necessary to remove the spring clip and heat sink assembly 62 from the chip module 44. i.e. for replacement of the chip, upward pressure is applied to either of the finger tabs 14 and 16 which very quickly and easily dislodges the corresponding projection of the tab from engagement with its respective downwardly facing edge surface of the chip module 44. The spring clip and the sink assembly 62 can also be applied to the chip module 44 by first positioning the projections 36 against the edge surface 54 and then applying downward pressure on the finger tab 16 to force the projection 38 in engagement with the edge surface 56 of the chip module 44. The spring clip and heat sink assembly 62 can be applied to and removed from a chip, such as the chip module 44, quickly and easily by hand without the need for special tools. Once applied to the chip module 44, the clip and heat sink assembly 62 remains in clamping position throughout its operation and is resistant to becoming loose due to vibrations and other conditions which are encountered during normal use of the electronic apparatus to which the chip module 44 is applied. However, the spring clip and heat sink assembly 62 can be removed very quickly and easily when it is desired to do so.

The ease with which the clip and heat sink assembly 62 can be applied to an electrical module also enables the assembly to be installed by automated apparatus such as robotics.

The spring clip and heat sink assembly 62 of the present invention can also be pre-assembled to a microprocessor module or any other electronic module prior to the installation of the microprocessor module into its complementary receptacle.

Clearly, minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. A clip for clamping a heat sink module to an electronic module, said clip comprising:
    (a) a substantially horizontal grid which includes a plurality of spaced ribs, said grid having a central section which has a first end and an opposite second end, a first resilient end section which is fixed to the first end of said central section and a second resilient end section which is fixed to the second end of said central section, said first and second resilient end sections extending upwardly from said central section, said first and second end sections being resiliently deflectable relative to said central section from an upper non-clamping position to a lower clamping position;
    (b) a first vertical leg which is fixed to said first resilient end section, said first vertical leg extending downwardly from said first resilient end section and having a first projection, said first projection having a first upwardly facing edge surface which slants downwardly toward said grid; and
    (c) a second vertical leg which is fixed to said second resilient end section and having a second projection, said second projection having a second upwardly facing edge surface which slants downwardly toward said grid, said first and second projections moving towards each other when said first and second resilient end sections are moved from said non-clamping position to said clamping position.

2. A clip as recited in claim 1, wherein there is an additional first vertical leg which is spaced from said first vertical leg and wherein there is a first horizontal finger tab which is fixed to said first vertical leg and to said additional first vertical leg.

3. A clip as recited in claim 2, wherein there is an additional second vertical leg which is spaced from said second vertical leg and a second horizontal finger tab which is fixed to said second vertical leg and to said additional second vertical leg.

4. A clip as recited in claim 3, wherein each of said finger tabs is horizontal.

5. A clip for clamping a heat sink module to an electronic module, said clip comprising:
    (a) a substantially horizontal grid which includes a plurality of spaced ribs, said grid having a central section which has a first end and an opposite second end, a first resilient end section which is fixed to the first end of said central section and a second resilient end section which is fixed to the second end of said central section, said first and second resilient end sections extending upwardly from said central section, said first and second end sections being resiliently deflectable relative to said central section from an upper non-clamping position to a lower clamping position;
    (b) a flat first vertical leg which is fixed to said first resilient end section, said first vertical leg extending downwardly from said first resilient end section and having a first flat projection which extends toward said grid, said first projection having a first upwardly facing edge surface which faces toward said grid, said first vertical leg and said first projection lying in a first vertical plane which extends longitudinally of said clip; and
    (c) a flat second vertical leg which is fixed to said second resilient end section and having a second projection which extends toward said grid, said second projection having a second upwardly facing edge surface which faces toward said grid, said second vertical leg and said second projection lying in a second vertical plane which extends longitudinally of said clip, said first and second projections moving towards each other when said first and second resilient sections are moved from said non-clamping position to said clamping position.

6. A clip for clamping a heat sink as recited in claim 5, wherein said first vertical leg and said first projection are rigid within said first vertical plane and said second vertical leg and said second projection are rigid within said second vertical plane.

7. A clip for clamping a heat sink module to an electronic module, said clip being configured from a flat bendable resilient metal sheet and comprising:
    (a) a substantially horizontal grid portion which has a plurality of apertures, said grid portion having a central section, a first horizontal end section, a second horizontal end section, a first transition section and a second transition section, each of said first and second horizontal end sections being higher than said central section and having an inner end and a free outer end, said first transition section extending upwardly from said central section to the inner end of said first horizontal end section, said second transition section extending upwardly from said central section to the inner end of said second horizontal end section, said first and second horizontal end sections being resiliently deflectable relative to said central section from an upper non-clamping position to a lower clamping position;

(b) a first vertical leg portion which is fixed to the free end of said first horizontal end section and which extends downwardly from said first horizontal end section, said first vertical leg portion having a first projection, said first projection having a first upwardly facing edge surface which slants downwardly toward said grid portion; and (c) a second vertical leg portion which is fixed to the free end of said second horizontal end section and which extends downwardly from said second horizontal end section, said second vertical leg portion having a second upwardly facing edge surface which slants downwardly toward said grid portion, said first and second projections moving downwardly and towards each other when said first and second horizontal end sections are deflected from said non-clamping position to said clamping position, said first and second projections being biased upwardly by said first and second horizontal end sections when said first and second horizontal end sections are in said clamping position.

8. A spring clip and heat sink assembly for application to an electronic module having a flat upper surface, a first downwardly facing edge surface and a second downwardly facing edge surface, said spring clip and heat sink assembly comprising:

(a) a heat sink module having a base which has a first end surface, a second end surface, an upper surface and a bottom surface for abutting the upper surface of an electronic module, said heat sink module having a plurality of upwardly extending vertical cooling elements which are fixed to the upper surface of said base;

(b) a spring clip which is made of a bendable and resilient material and which comprises:

(1) a horizontal central section which rests on the upper surface of said base;

(2) a flexible resilient first end section which is fixed to said central section and which is cantilevered from said central section toward said first end surface so that said first end section is spaced from the upper surface of said base, said first end section having a free end;

(3) a flexible resilient horizontal second end section which is fixed to said central section and which is cantilevered from said central section toward said second end surface so that said first end section is spaced from the upper surface of said base, said first end section having a free end;

(4) a first vertical leg which is fixed to the free end of said first end section and which extends downwardly along said first end surface, said first leg having a first projection, said first projection having a first upwardly facing edge surface which slants downwardly toward said heat sink module for engaging a first downwardly facing edge surface of an electronic module upon bending of said first end section downwardly relative to said central section for biasing said first upwardly facing edge surface upwardly against the first downwardly facing edge surface of the electronic module by the resiliency of said first end section; and (5) a second vertical leg which is fixed to the free end of said second end section and which extends downwardly along said second end surface, said second leg portion having a second projection, said second projection having a second upwardly facing edge surface which slants downwardly toward said heat sink module for engaging the second downwardly facing edge surface of the electronic module upon bending of said second end portion downwardly relative to said central section for biasing said second upwardly facing edge surface upwardly against the second downwardly facing edge surface of the electronic module by the resiliency of said second end section.

9. A spring clip and heat sink assembly as recited in claim 8, wherein there is an additional first vertical leg which is spaced from said first vertical leg and wherein there is a first horizontal finger tab which is fixed to said first vertical leg and to said additional first vertical leg, said first finger tab being located outside of said heat sink module.

10. A spring clip and heat sink assembly as recited in claim 9, wherein there is an additional second vertical leg which is spaced from said second vertical leg and wherein there is a second horizontal finger tab which is fixed to said second vertical leg and to said additional second vertical leg, said second horizontal finger tab being located outside of said heat sink module.

11. A spring clip and heart sink assembly as recited in claim 8, wherein said spring clip and heat sink assembly further comprises:

(a) a first vertical locating tab which is adapted to extend downwardly along a third end surface of the electronic module; and (b) a second vertical locating tab which is adapted to extend downwardly along a fourth end surface of the electronic module.

12. A spring clip and heal sink assembly for application to an electronic module having a flat upper surface, a first downwardly facing edge surface and a second downwardly facing edge surface, said spring clip and heat sink assembly comprising:

(a) a heat sink module having a base which has a first end surface, a second end surface, an upper surface and a bottom surface for abutting the upper surface of an electronic module said heat sink module having a plurality of upwardly extending vertical cooling elements which are fixed to the upper surface of said base;

(b) a spring clip which is made of a bendable and resilient material and which comprises:

(1) a horizontal central section which rests on the upper surface of said base;

(2) a flexible resilient first end section which is fixed to said central section and which is cantilevered from said central section toward said first end surface so that said first end section is spaced from the upper surface of said base, said first end section having a free end;

(3) a flexible resilient horizontal second end section which is fixed to said central section and which is cantilevered from said central section toward said second end surface so that said first end section is spaced from the upper surface of said base, said first end section having a free end;

(4) a first vertical leg which is fixed to the free end of said first end section and which extends downwardly along said first end surface, said first leg having a first projection, said first projection having a first upwardly facing edge surface for engaging a first downwardly facing edge surface of an electronic module upon bending of said first end section downwardly relative to said central section for biasing said first upwardly facing edge surface upwardly against the first downwardly facing edge surface the electronic module by the resiliency of said first end section, said first vertical leg being relatively flat and having a broad side which lies within a vertical plane which is transverse to the first end surface of said heat sink module; and (5) a second vertical leg which is fixed to the free end of said second end section and which extends downwardly along said second end surface, said second leg having a second projection, said second projection having a second upwardly facing edge surface for engaging a second downwardly facing edge surface of the electronic module upon bending of said second end section downwardly relative to said central section for biasing said second upwardly facing edge surface upwardly against the second downwardly facing edge surface of the electronic module by the resiliency of said second end section, said second vertical leg being relatively flat and having a broad side which lies within a vertical plane which is transverse to the second end surface of said heat sink module.

13. A clamping heat sink and electronic module assembly comprising:

(a) an electronic module having a first base which includes a flat upper surface, a first vertical end surface, a first downwardly facing edge surface which defines a first lower corner with said first vertical end surface, a second vertical end surface opposite said first end surface, a second downwardly facing edge surface which defines a second lower corner with said second vertical end surface;

(b) a heat sink module having a second base which has an upper surface and a bottom surface for abutting the upper surface of said first base, said heat sink module having a plurality of spaced parallel rows of upwardly extending vertical cooling pins which are fixed to the upper surface of said second base; and (c) a clip having a clamping position and a non-clamping position and comprising:

(1) a substantially horizontal grid, which includes a plurality of spaced ribs which extend between said rows of cooling pins, said grid having a central section which engages the upper top surface of said second base when said clip is in a clamping position, a first resilient end section which is fixed to said central section and which is spaced from the upper surface of said second base, and a second resilient end section which is fixed to said central section and which is spaced from the upper surface of said second base, (2) a first vertical leg which is fixed to the first end section of said grid and which extends along the first end surface of said first base, said first leg having a first projection which extends toward said first end surface, said first projection having a first upwardly facing edge surface which engages said first downwardly facing edge surface at said first lower corner when said clip is in said clamping position, (3) a second vertical leg which is fixed to the second section of said grid and which extends along the second end surface of said first base, said second leg having a second projection which extends toward said second end surface, said second projection having a second upwardly facing edge surface which engages said second downwardly facing edge surface at said second lower corner when said clip is in said clamping position, the distance between said first and second projections being less than the distance between said first and second end surfaces when said clip is in said non-clamping position, said first and second projections being movable away from one another by bending of the first and second sections of said grid upwardly relative to the central section of said grid to enable said clip to be moved toward and away from said clamping position with said combined heat sink module and said electronic module, said first and second projections being movable toward one another and downwardly relative to the central section of said grid by bending said first and second end sections downwardly relative to said central section so that when said first and second end sections are bent downwardly relative to said central section, said clip is in said clamping position, said first upwardly facing edge surface is biased upwardly against said first downwardly edge surface and said second upwardly facing edge surface is biased upwardly against said second downwardly facing edge surface due to the resiliency of the first and second sections of said grid.

14. A heat sink and electronic module assembly as recited in claim 13, wherein each of said first and second upwardly facing edge surfaces slants downwardly toward said heat sink module.

15. A clip as recited in claim 13, wherein each of said first and second vertical legs is rigid within a vertical plane which is transverse to the first and second end surfaces of said heat sink module.

16. A heat sink and electronic module assembly as recited in claim 13, wherein said clip is configured from a flat piece of bendable resilient metal stock and each of said first and second legs is formed from a tab which extends transversely to said rows of pins and bent along a line which is parallel to said rows of pins so that each of said legs has a broad dimension which lies within a vertical plane which is transverse to the first and second end surfaces of said heat sink module and is rigid within said vertical plane.

17. A heat sink and electronic module assembly as recited in claim 13, wherein there is an additional first vertical leg which is spaced from said first vertical leg and wherein there is a first horizontal finger tab which is fixed to said first vertical leg and to said additional first vertical leg and is located outside of said heat sink module.

18. A heat sink and electronic module assembly as recited in claim 17, wherein there is an additional second vertical leg which is spaced from said second vertical leg and a second horizontal finger tab which is fixed to said second vertical leg and to said additional second vertical leg and is located outside of said heat sink module.

19. A heat sink and electronic module assembly as recited in claim 13, wherein said electronic module has a third vertical end surface and a fourth vertical end surface, each of said third and fourth end surfaces being transverse to said first and second end surfaces, and wherein said clip further comprises:
(a) a first vertical locating tab which extends downwardly along said third end surface; and
(b) a second vertical locating tab which extends downwardly along said fourth end surface.

* * * * *